United States Patent
Treffler et al.

(10) Patent No.: US 10,481,657 B2
(45) Date of Patent: Nov. 19, 2019

(54) COOLING ARRANGEMENT AND AIR DEFLECTOR

(71) Applicant: Fujitsu Technology Solutions Intellectual Property GmbH, München (DE)

(72) Inventors: Roland Treffler, München (DE); August Scherer, München (DE)

(73) Assignee: Fujitsu Client Computing Limited, Kawasaki (JP)

( * ) Notice: Subject to any disclaimer, the term of this patent is extended or adjusted under 35 U.S.C. 154(b) by 0 days.

(21) Appl. No.: 15/876,935

(22) Filed: Jan. 22, 2018

(65) Prior Publication Data

US 2018/0210523 A1 Jul. 26, 2018

(30) Foreign Application Priority Data

Jan. 23, 2017 (DE) .................. 10 2017 101 206

(51) Int. Cl.
| | | |
|---|---|---|
| *G06F 1/20* | (2006.01) | |
| *H05K 7/20* | (2006.01) | |
| *G06F 1/18* | (2006.01) | |
| *G11B 33/14* | (2006.01) | |

(52) U.S. Cl.
CPC .............. *G06F 1/206* (2013.01); *G06F 1/183* (2013.01); *G06F 1/20* (2013.01); *H05K 7/20145* (2013.01); *H05K 7/20209* (2013.01); *G11B 33/144* (2013.01)

(58) Field of Classification Search
CPC ........ G06F 1/203; G06F 1/1681; G06F 1/181; G06F 2200/201; G06F 2200/203; G06F 1/20; G06F 1/206; H05K 7/20145; H05K 7/20009; H05K 7/20209; H05K 7/20618; H05K 7/20181; H01L 23/467; H01L 23/367; G11B 33/142; G11B 33/144; F28F 9/0268
USPC ...... 361/679.51, 679.46, 679.49, 695, 679.5; 454/184
See application file for complete search history.

(56) References Cited

U.S. PATENT DOCUMENTS

| | | | | |
|---|---|---|---|---|
| 3,762,778 A | * | 10/1973 | Boggs ................ | B62D 55/0887 305/118 |
| 5,287,244 A | | 2/1994 | Hileman et al. | |
| 5,937,937 A | * | 8/1999 | Sehmbey ............ | F28D 15/0233 165/104.14 |
| 6,181,557 B1 | * | 1/2001 | Gatti .................. | H05K 7/20618 165/122 |
| 2004/0240175 A1 | * | 12/2004 | Brovald .................... | G06F 1/20 361/679.5 |
| 2006/0012208 A1 | * | 1/2006 | Brash ..................... | B60J 1/2005 296/91 |
| 2008/0068796 A1 | * | 3/2008 | Pav ........................... | G06F 1/20 361/695 |

(Continued)

*Primary Examiner* — Mandeep S Buttar
(74) *Attorney, Agent, or Firm* — DLA Piper LLP (US)

(57) ABSTRACT

A cooling arrangement for a computer system includes a chassis, a circuit board arranged in the chassis, a fan, and at least one element to be cooled and arranged on the circuit board in an area to be cooled between the fan and a panel of the chassis, wherein an air deflector is arranged between the at least one element to be cooled and the panel of the chassis such that air flowing out of the fan in a direction of the at least one element to be cooled encounters the air deflector and is swirled in the area to be cooled.

14 Claims, 2 Drawing Sheets

(56) References Cited

U.S. PATENT DOCUMENTS

| | | | | |
|---|---|---|---|---|
| 2011/0064546 A1* | 3/2011 | Merrow | ............... | G11B 33/128 414/226.05 |
| 2017/0006697 A1* | 1/2017 | Yoneda | .............. | H05K 7/20154 |

* cited by examiner

COOLING ARRANGEMENT AND AIR DEFLECTOR

TECHNICAL FIELD

This disclosure relates to a cooling arrangement, in particular for a computer system, comprising a chassis, a circuit board arranged in the chassis, and a fan. The disclosure also relates to an air deflector.

BACKGROUND

Fans are used in computer systems, mostly in connection with cooling arrangements to cool components. Among those components, for example, are processors. In many cases, there are, however, also heat-generating elements in the vicinity of those components requiring cooling. To ensure this, air ducts are mounted between the fans or the heat sinks and the heat-generating elements. They cool those elements with exhaust air of the fan. A problem is that, in particular during high fan speeds, accumulation of air can form in the air ducts. A further problem is that for each kind of heat sink and for each possible arrangement of elements to be cooled, specially made air ducts are required on a circuit board.

There is thus a need for an improved cooling arrangement.

SUMMARY

We provide a cooling arrangement for a computer system including a chassis, a circuit board arranged in the chassis, a fan, and at least one element to be cooled and arranged on the circuit board in an area to be cooled between the fan and a panel of the chassis, wherein an air deflector is arranged between the at least one element to be cooled and the panel of the chassis such that air flowing out of the fan in a direction of the at least one element to be cooled encounters the air deflector and is swirled in the area to be cooled.

We also provide an air deflector for a computer system, including a planar first plane on a first side and, on a second side facing away from the first side, an attachment device including at least one pin adapted to attach the air deflector onto a suitable part of the computer system.

We further provide a computer system including a chassis, a circuit board arranged in the chassis, a fan, and at least one element to be cooled and arranged on the circuit board in an area to be cooled between the fan and a panel of the chassis, wherein an air deflector is arranged between the at least one element to be cooled and the panel of the chassis such that air flowing out of the fan in the direction of the at least one element to be cooled encounters the air deflector and is swirled in the area to be cooled.

LIST OF REFERENCE CHARACTERS

Figure 1:
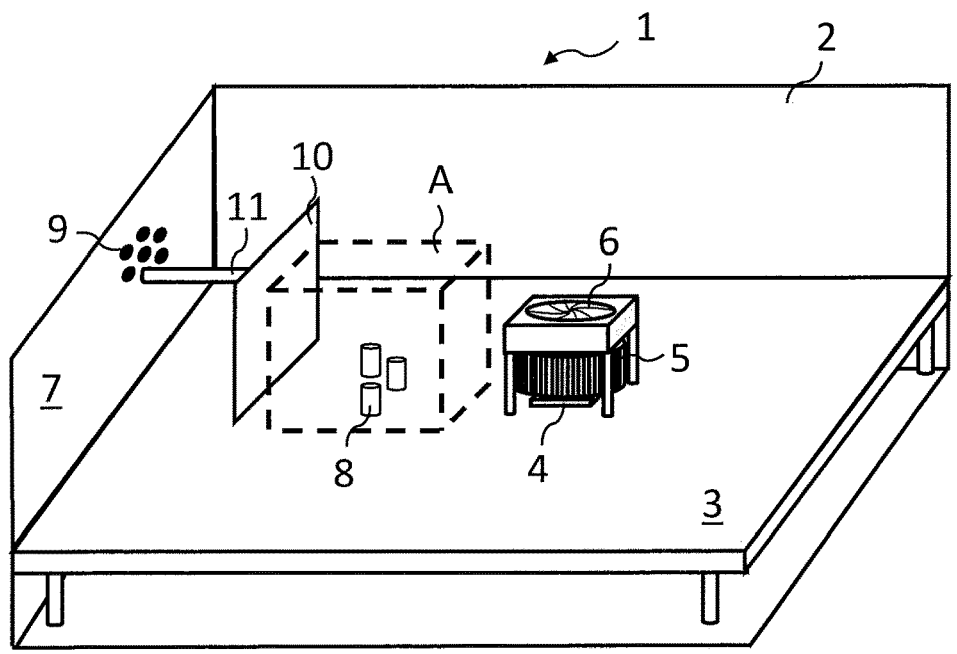
FIG. 1 shows a cooling arrangement according to an example.

1 Cooling arrangement
2 Chassis
3 Circuit board
4 Processor
5 Heat sink
6 Fan
7 Panel
8 Element to be cooled
9 Ventilation opening
10 Air deflector
11, 11 a-c Pin
30 First plane
31 Second plane
33a-c Wing
34 Plug connector
35a, 35b Opening
A Area to be cooled
X First longitudinal side
Y Second longitudinal side
P1 to P5 arrow

DETAILED DESCRIPTION

We provide a cooling arrangement comprising a chassis, a circuit board arranged in the chassis, a fan, and at least one element to be cooled arranged on the circuit board in an area to be cooled between the fan and a panel of the chassis. The cooling arrangement further comprises an air deflector. The air deflector is arranged between the at least one element to be cooled and the panel of the chassis such that air flowing out of the fan in the direction of the at least one element to be cooled encounters the air deflector and is swirled in the area to be cooled. The air deflector may be, for example, an additional part.

An advantage of this cooling arrangement is that air flowing out of the fan can quickly dissipate and, therefore, no build-ups of air can develop. A further advantage is that the air deflector can be used in the computer system independently of the configuration of the fan. For various kinds of heat sinks and/or fans the same air deflector can therefore always be used. Also, the same air deflector can always be used for various arrangements of elements to be cooled on a circuit board. Compared to a cooling arrangement without an air deflector, less fan speed is needed to cool in this cooling arrangement. The system is therefore quieter.

The air deflector may comprise a planar first plane facing the fan. An advantage of this configuration is that on such a kind of air deflector, hardly any dust can accumulate. Dust accumulations are frequently a problem in cooling arrangements. Further configurations of the shape of the air deflector are possible.

A second plane angled relative to the planar first plane may be arranged on a first longitudinal side of the planar first plane. The angled second plane causes a directed flow of the swirled air. Air encountering the first plane and escaping in the direction of the first longitudinal side is forced into a swirl by the second plane and encounters, according to the angle between the two planes, specifically the elements to be cooled.

Advantageously, the air deflector may consist of a plastic material.

The air deflector may be arranged on the chassis. This has the advantage that no attachment device is needed for the air deflector on the circuit board. A chassis mostly offers free surfaces onto which an attaching of the air deflector is possible without problems. Another advantage of this configuration is that the air deflector can already be introduced during manufacture of the chassis.

The air deflector may comprise at least one pin through which the air deflector is attached to at least one ventilation opening of the chassis.

The at least one pin may have the shape of a hollow cylinder, which is open on both end faces. This has the advantage, that no ventilation openings are closed during an attaching of the air deflector to a ventilation opening.

We also provide an air deflector, in particular for a computer system. The air deflector comprises a planar first plane on a first side. On a second side facing away from the first side, the air deflector comprises an attachment device such as at least one pin for attachment of the air deflector to a suitable part of the computer system.

Further advantageous examples are disclosed in the appended claims, as well as the subsequent description of the figures. In the figures, various instances of similar components are indicated by alphabetical suffixes. Additionally, similar references are used for elements with substantially similar functions, these elements, however, do not need to be identical in all details.

FIG. 1 shows a cooling arrangement 1 for a computer system according to an example. The cooling arrangement 1 includes a chassis 2 in which a circuit board 3 is arranged. On the circuit board 3, a processor 4 is arranged. A heat sink 5 is attached above the processor 4, and above the heat sink 5, a fan 6 is attached. The fan 6 spins so that air is blown onto the heat sink 5 for the cooling of the processor 4.

Three elements 8 to be cooled are arranged in an area A to be cooled on the circuit board 3 between the processor 4 and a panel 7 of the chassis 2. In this example, the elements 8 to be cooled are so-called core voltage controllers that regulate a voltage supply of processor cores of the processor 4. Capacitors, for example, are used as components for this purpose. The elements 8 to be cooled can, however, certainly also be transistors, operational amplifiers, or other heat-generating elements.

The panel 7 of the chassis 2 comprises a plurality of ventilation openings 9. Warm exhaust air is discharged out of the chassis 2 of the computer system, and/or fresh air for cooling is drawn in the computer system through the ventilation openings 9.

An air deflector 10 is arranged between the elements 8 to be cooled and the panel 7 of the chassis 2. The air deflector 10 is located directly behind the elements 8 to be cooled and, in this example, has a planar surface on its side facing the fan 6. This surface corresponds to a rectangle, wherein a bottom side edge of the rectangle rests on the circuit board 3. The other three side edges of the rectangle stand freely in the interior of the chassis 2. The air deflector 10 is arranged parallel to the panel 7 of the chassis 2. Other suitable arrangements and configurations of the air deflector 10 are also certainly possible. The air deflector 10 is arranged in the chassis 2 such that it interrupts an unimpeded air flow from the fan 6 to the ventilation openings 9.

The air deflector 10 is fastened via a pin 11 in this example. The pin 11 is arranged on a rear side of the air deflector 10. The rear side of the air deflector 10 is facing the panel 7 of the chassis 2. The pin 11 is detachably connected via a plug connection with the ventilation openings 9.

The air deflector 10 is independent from the configuration of the heat sink 5 and the fan 6. In this example, a star-shaped heat sink 5 and a so-called top-blower fan 6 is used. However, any desired shapes, configurations, and combinations of heat sinks 5 and fans 6 can be used, without a different air deflector 10 being needed. Heat sinks 5 and fans 6 can also be exchanged without the air deflector 10 having to be removed. This offers a significantly higher flexibility during an assembling of the system, and considerable time-savings during production.

Figure 2:
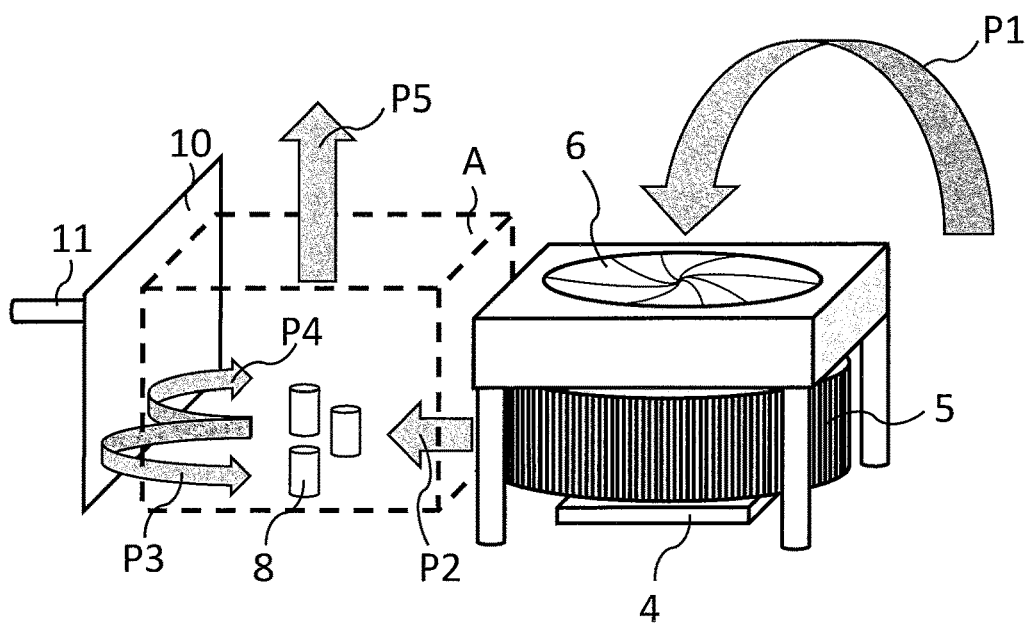
FIG. 2 shows an enlargement of a section from FIG. 1.

FIG. 2 shows an enlarged section of the cooling arrangement 1, according to the example from FIG. 1. In this section, the processor 4, the heat sink 5, the fan 6, the elements 8 to be cooled and the air deflector 10 can be seen with a part of the pin 11. Furthermore, this figure shows the air flow of the cooling arrangement 1 with the arrows P1 to P5.

The fan 6 sucks cold fresh air in the direction of the arrow P1. The cold fresh air is blown from the fan 6 onto the heat sink 5, and the processor 4 is cooled. The heat sink 5 has cooling ridges, between which there are hollow/open spaces. The air flows laterally out of the hollow/open spaces between the cooling ridges of the heat sink 5. The air, which, inter alia, flows in the direction of the arrow P2 out of the heat sink 5, has a higher temperature than the cold fresh air, but is still suitable for cooling the elements 8.

Air flowing in the direction of the arrow P2 encounters the air deflector 10 and is swirled in the area A to be cooled. This is indicated by arrows P3 and P4. If the air merely blew over the elements 8 to be cooled in the direction of arrow P2 and then escaped from area A to be cooled in an unhindered manner, the cooling effect would be significantly smaller than in the illustrated cooling arrangement 1. In particular, this is the case if the elements 8 to be cooled are relatively flat since these elements pose a small surface to the direct air flow in the direction of arrow P2. In this example, the air is horizontally swirled in the direction of arrows P3 and P4. Other swirls such as vertical swirls can be generated with other configurations of the air deflector 10. In particular, in specific examples of the air deflector 10, the swirl of the air can be specifically directed to the elements to be cooled 8.

Warm exhaust air subsequently exits the area to be cooled A in the direction of arrow P5. Thus, build-ups of exhaust air that impede cooling cannot be generated in this configuration. Subsequently, the warm exhaust air can escape the chassis 2 of the computer system through the ventilation openings 9 shown in FIG. 1.

Figure 3:
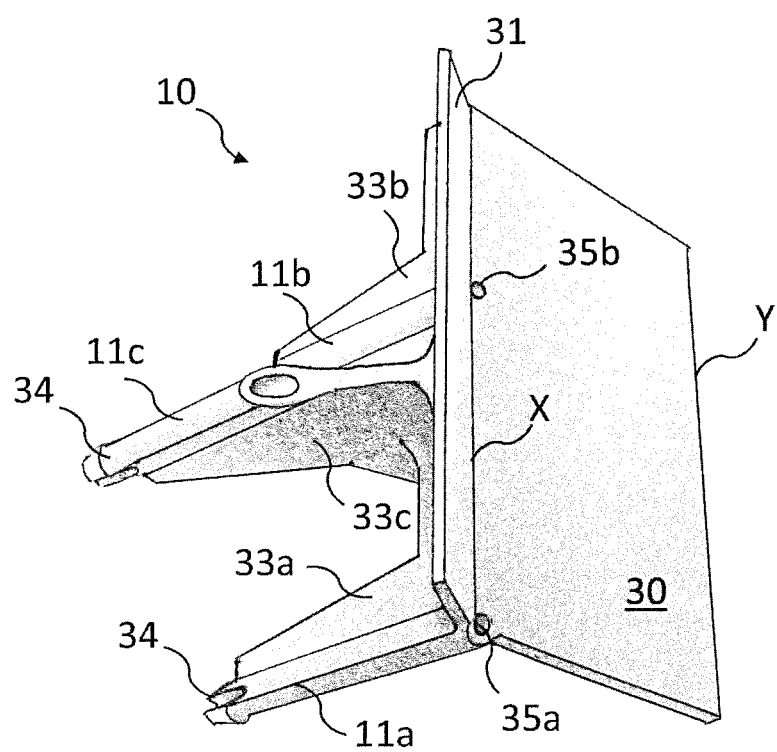
FIG. 3 shows an air deflector according to an example.

FIG. 3 shows another example of an air deflector 10 for a cooling arrangement 1. The air deflector 10 comprises a planar first plane 30 on a first side. This smooth surface substantially has the shape of a rectangle. The rectangle comprises a first and a second longitudinal side X and Y.

A second plane 31, which is angled-off in relation to the planar first plane 30, follows on the first longitudinal side X. The second plane 31 extends over the entire length of the first longitudinal side X and, in this example, has a fifth of the area of the first plane 30. The air deflector 10 is arranged in a chassis such that the second longitudinal side Y rests on a circuit board and the angled second plane 31 is free-standing.

The first plane 30 stands obliquely on the circuit board. An angle greater than 90° is present on the side facing the air flow between the first plane 30 and the circuit board. In this case, the first plane 30 is not parallel to a panel of the chassis. The second plane 31 is not arranged parallel to the panel of the chassis, but arranged at an angle in the direction of the first side of the air deflector 10. The second plane 31 has an angle of less than 90° in relation to the circuit board on the side facing the air flow.

This configuration of the air deflector 10 generates a vertical swirl of the air, which encounters the air deflector 10 when exiting the fan. The air encounters the inclined first surface 30 and is deflected in the direction of the first longitudinal side X. On the first longitudinal side X, the air encounters the angled plane 31 and is forced into a roll-shaped swirl. Preferably, the planes 30, 31 are configured and arranged such that the swirled air specifically encounters the elements to be cooled before it escapes.

On a second side facing away from the first side, the air deflector 10 comprises three pins 11a, 11b, 11c, by which the air deflector 10 is fastened to a chassis of a computer system. The pins 11a, 11b, 11c have the shape of hollow cylinders and are each reinforced by a wing 33a, 33b, 33c on at least one side. On the ends of the pins 11a, 11b, 11c facing away from the second side of the deflector 10, the pins each comprise a plug connector 34, by which the pins 11a, 11b, 11c can e.g. be inserted and latched with in each case one ventilation opening of a chassis. The plug-connectors 34 are configured such that they do not cover the hollow cylinders, but allow an air flow in and out of the hollow cylinders.

Two of the pins 11a, 11b are attached on the second side of the deflector 10 below the first longitudinal side X. In the planar first plane 30, in each case one opening 35a, 35b is located on both attachment points, the size of which openings corresponds to the internal diameter of the hollow cylinder of the pins 11a, 11b. The third pin 11c is arranged at the height of the angled plane 31. The third pin 11c does not extend all the way to the angled plane 31, but connects to the second side of the deflector 10 only via the wing 33c.

Although our cooling arrangements and air deflectors have been described in connection with specific forms thereof, it will be appreciated that a wide variety of equivalents may be substituted for the specified elements described herein without departing from the spirit and scope of this disclosure as described in the appended claims.

What is claimed is:

1. A cooling arrangement for a computer system comprising a chassis, a circuit board arranged in the chassis, a fan, and at least one element to be cooled and arranged on the circuit board in an area to be cooled between the fan and a panel of the chassis,
   wherein an air deflector is arranged between the at least one element to be cooled and the panel of the chassis such that air flowing out of the fan in a direction of the at least one element to be cooled encounters the air deflector,
   the air deflector comprises a planar first plane oriented toward the fan, which planar first plane extends from the circuit board higher than the at least one element to be cooled,
   the air deflector is arranged to swirl the air flowing out of the fan in the direction of the at least one element to be cooled in the area to be cooled,
   a second plane angled relative to the planar first plane is attached on a first longitudinal side of the planar first plane, and
   the second plane has an angle of less than 90° in relation to the circuit board on the side facing the air flowing out of the fan.

2. The cooling arrangement according to claim 1, wherein the air deflector consists of a plastic material.

3. The cooling arrangement according to claim 1, wherein the air deflector is arranged on the chassis.

4. The cooling arrangement according to claim 3, wherein the air deflector comprises at least one pin, by which the air deflector is attached on at least one ventilation opening of the chassis.

5. The cooling arrangement according to claim 4, wherein the at least one pin has the shape of a hollow cylinder, which is open on both end faces.

6. The air deflector according to claim 1, comprising the planar first plane on a first side and, on a second side facing away from the first side, an attachment device comprising at least one pin adapted to attach the air deflector onto a suitable part of the computer system such that the planar first plane is oriented toward the fan.

7. The air deflector according to claim 6, wherein a second plane which is angled relative to the planar first plane is attached on a first longitudinal side of the planar first plane.

8. The computer system according to claim 1, comprising the chassis, the circuit board arranged in the chassis, the fan, the at least one element to be cooled and arranged on the circuit board, and
   the air deflector.

9. The computer system according to claim 8, wherein the air deflector is located directly behind the elements to be cooled.

10. The computer system according to claim 8, wherein the fan is a top-blower fan.

11. The computer system according to claim 8, wherein the air deflector is detachably connected with the chassis.

12. A cooling arrangement for a computer system comprising a chassis, a circuit board arranged in the chassis, a fan, and at least one element to be cooled and arranged on the circuit board in an area to be cooled between the fan and a panel of the chassis,
    wherein an air deflector is arranged between the at least one element to be cooled and the panel of the chassis such that air flowing out of the fan in a direction of the at least one element to be cooled encounters the air deflector,
    the air deflector comprises a planar first plane oriented toward the fan, which planar first plane extends from the circuit board higher than the at least one element to be cooled, and
    the air deflector is arranged to swirl the air flowing out of the fan in the direction of the at least one element to be cooled in the area to be cooled,
    the air deflector comprises at least one pin, by which the air deflector is attached on at least one ventilation opening of the chassis, and
    the at least one pin has the shape of a hollow cylinder, which is open on both end faces.

13. The air deflector according to claim 12, comprising the planar first plane on a first side and, on a second side facing away from the first side, an attachment device comprising at least one pin adapted to attach the air deflector onto a suitable part of the computer system such that the planar first plane is oriented toward the fan.

14. The computer system according to claim 12, comprising the chassis, the circuit board arranged in the chassis, the fan, the at least one element to be cooled and arranged on the circuit board, and the air deflector.

* * * * *